United States Patent
Olch et al.

(10) Patent No.: US 10,941,610 B2
(45) Date of Patent: *Mar. 9, 2021

(54) WATER-TIGHT COMPARTMENT WITH REMOVABLE HATCH AND TWO-SIDED GEL SEAL FOR MULTIPLE CONDUIT ACCESS

(71) Applicant: AeroVironment, Inc., Monrovia, CA (US)

(72) Inventors: Ronald H. Olch, Van Nuys, CA (US); Pavel Belik, Simi Valley, CA (US)

(73) Assignee: AeroVironment, Inc., Simi Valley, CA (US)

( * ) Notice: Subject to any disclaimer, the term of this patent is extended or adjusted under 35 U.S.C. 154(b) by 129 days.

This patent is subject to a terminal disclaimer.

(21) Appl. No.: 16/123,838

(22) Filed: Sep. 6, 2018

(65) Prior Publication Data
US 2019/0078381 A1    Mar. 14, 2019

Related U.S. Application Data

(63) Continuation of application No. 15/248,929, filed on Aug. 26, 2016, now Pat. No. 10,094,165, which is a
(Continued)

(51) Int. Cl.
*B64C 1/14* (2006.01)
*B63B 19/14* (2006.01)
(Continued)

(52) U.S. Cl.
CPC ............ *E06B 7/2314* (2013.01); *B63B 19/14* (2013.01); *B63B 19/26* (2013.01); *B64C 1/1446* (2013.01)

(58) Field of Classification Search
CPC ........ B64C 1/1446; B64C 1/14; H02G 3/088; H02G 15/113; H05K 5/061; B65D 2543/00296; E06B 7/2314
See application file for complete search history.

(56) References Cited

U.S. PATENT DOCUMENTS 2,392,835 A    1/1946   Conlon
2,899,256 A    8/1959   Kelley
(Continued)

FOREIGN PATENT DOCUMENTS

GB              614322 A     12/1948

OTHER PUBLICATIONS

International Searching Authority; International Search Report (ISR) for corresponding PCT case application No. PCT/US2012/042673 entitled Water-tight compartment with removable hatch and two-sided gel seal for multiple conduit access by Olch et al.; dated Jan. 25, 2013 from US International Searching Authority; 5 pgs.
(Continued)

*Primary Examiner* — Justin B Rephann
(74) *Attorney, Agent, or Firm* — Christopher R. Balzan, Esq.; Eric J. Aagaard, Esq.

(57) ABSTRACT

A water-tight or air-tight accessible compartment has a removable hatch sealed at the edge with elastically conformable opposing seals, with elongate communication elements extending into the compartment between the opposing seals, seals conforming to the topology formed between the compartment edge and the elongate communication elements.

16 Claims, 16 Drawing Sheets

Related U.S. Application Data continuation of application No. 14/239,749, filed as application No. PCT/US2012/042673 on Jun. 15, 2012, now Pat. No. 9,476,251.

(60) Provisional application No. 61/525,489, filed on Aug. 19, 2011.

(51) Int. Cl.
  *E06B 7/23* (2006.01)
  *B63B 19/26* (2006.01)

(56) References Cited

U.S. PATENT DOCUMENTS

| | | | |
|---|---|---|---|
| 3,077,284 A | 2/1963 | McLaughlin | |
| 3,576,937 A | 5/1971 | Eldridge, Jr. | |
| 3,910,448 A | 10/1975 | Evans et al. | |
| RE28,756 E | 4/1976 | Fork | |
| 4,303,251 A | 12/1981 | Harra et al. | |
| 4,313,609 A | 2/1982 | Clements | |
| 4,358,025 A | 11/1982 | Urion | |
| 4,490,614 A | 12/1984 | Peerenboom et al. | |
| 4,620,061 A | 10/1986 | Appleton | |
| 5,052,851 A | 10/1991 | Frishauf | |
| 5,110,235 A | 5/1992 | Thomann et al. | |
| 5,182,696 A | 1/1993 | Her | |
| 5,231,948 A | 8/1993 | Malmanger et al. | |
| 5,310,075 A | 5/1994 | Wyler | |
| 5,355,628 A * | 10/1994 | Dranchak | B60J 10/38 49/483.1 |
| 5,875,821 A | 3/1999 | Dumser et al. | |
| 6,099,340 A | 8/2000 | Florentine | |
| 6,118,076 A | 9/2000 | Damm et al. | |
| 6,233,160 B1 | 5/2001 | Shockley | |
| 6,350,949 B1 | 2/2002 | Boyd | |
| 6,492,590 B1 | 2/2002 | Cheng | |
| 6,386,405 B1 | 5/2002 | Kars et al. | |
| 6,494,464 B1 | 12/2002 | Chandler et al. | |
| 6,563,047 B2 | 5/2003 | Lambiaso | |
| 6,598,883 B1 | 7/2003 | Hammi | |
| 6,644,596 B1 | 11/2003 | Jurlina et al. | |
| 6,719,166 B2 | 4/2004 | Ceolin et al. | |
| 6,768,054 B2 | 7/2004 | Sato et al. | |
| 6,881,901 B2 | 4/2005 | Egan | |
| 7,141,738 B2 | 11/2006 | Marsac et al. | |
| 7,185,941 B2 * | 3/2007 | Klein | B60J 10/244 296/107.04 |
| 7,249,566 B1 | 7/2007 | Kyle | |
| 7,314,198 B2 | 1/2008 | Myers et al. | |
| 7,661,680 B2 * | 2/2010 | Langberg | F16J 15/061 277/629 |
| 7,757,384 B2 | 7/2010 | MacAuley | |
| 7,762,415 B2 | 7/2010 | Matsui | |
| 8,476,540 B2 | 7/2013 | Dahl et al. | |
| 8,662,451 B2 | 3/2014 | Delgado Jareno et al. | |
| 8,684,216 B2 | 4/2014 | Tachibana | |
| 8,901,422 B2 | 12/2014 | Yamauchi et al. | |
| 9,476,251 B2 | 10/2016 | Olch et al. | |
| 9,517,830 B2 * | 12/2016 | Hariram | B64C 1/1407 |
| 10,094,165 B2 | 10/2018 | Olch et al. | |
| 2002/0079653 A1 | 6/2002 | Noguchi | |
| 2003/0037950 A1 | 2/2003 | Lambiaso | |
| 2004/0031884 A1 | 2/2004 | Lambiaso | |
| 2005/0185381 A1 | 8/2005 | Ono | |
| 2006/0081635 A1 | 4/2006 | Matsutori et al. | |
| 2007/0187551 A1 | 8/2007 | Myers et al. | |
| 2007/0199188 A1 | 8/2007 | Barker | |
| 2007/0204530 A1 | 9/2007 | Janesky | |
| 2007/0205197 A1 | 9/2007 | Burney | |
| 2008/0067288 A1 | 3/2008 | Eberth | |
| 2008/0298887 A1 | 12/2008 | Rudduck | |
| 2009/0101384 A1 | 4/2009 | Kawasaki et al. | |
| 2009/0166473 A1 | 7/2009 | Zuniga Sagredo | |
| 2009/0294591 A1 | 12/2009 | Ramirez Blanco et al. | |
| 2011/0079413 A1 | 4/2011 | Masumoto | |
| 2011/0266934 A1 | 11/2011 | Schindler | |
| 2012/0097794 A1 | 4/2012 | Fort et al. | |
| 2013/0074415 A1 | 3/2013 | Rix | |
| 2013/0081849 A1 | 4/2013 | Simmons | |
| 2013/0180176 A1 | 7/2013 | Tachibana | |
| 2014/0374133 A1 | 12/2014 | Rost | |

OTHER PUBLICATIONS

International Searching Authority; Written Opinion of the International Searching Authority (WO) for corresponding PCT case application No. PCT/US2012/042673 entitled Water-tight compartment with removable hatch and two-sided gel seal for multiple conduit access by Olch et al.; dated Jan. 25, 2013 from US International Searching Authority; 10 pgs.

International Searching Authority; Examiner's Search History for corresponding PCT case application No. PCT/US2012/042673 entitled Water-tight compartment with removable hatch and two-sided gel seal for multiple conduit access by Olch et al.; dated Jan. 25, 2013 from US International Searching Authority; 19 pgs.

Raytech GelTek Sealant Strip; Raychem product sheet Code H54380; dated Sep. 1995. <URL: http://www.raytech.co.at/products/PDF/GELS/GELTEK.PDF>; 2 pgs.

Dow Corning Geltek MSDS, 2003 All Pages.

* cited by examiner

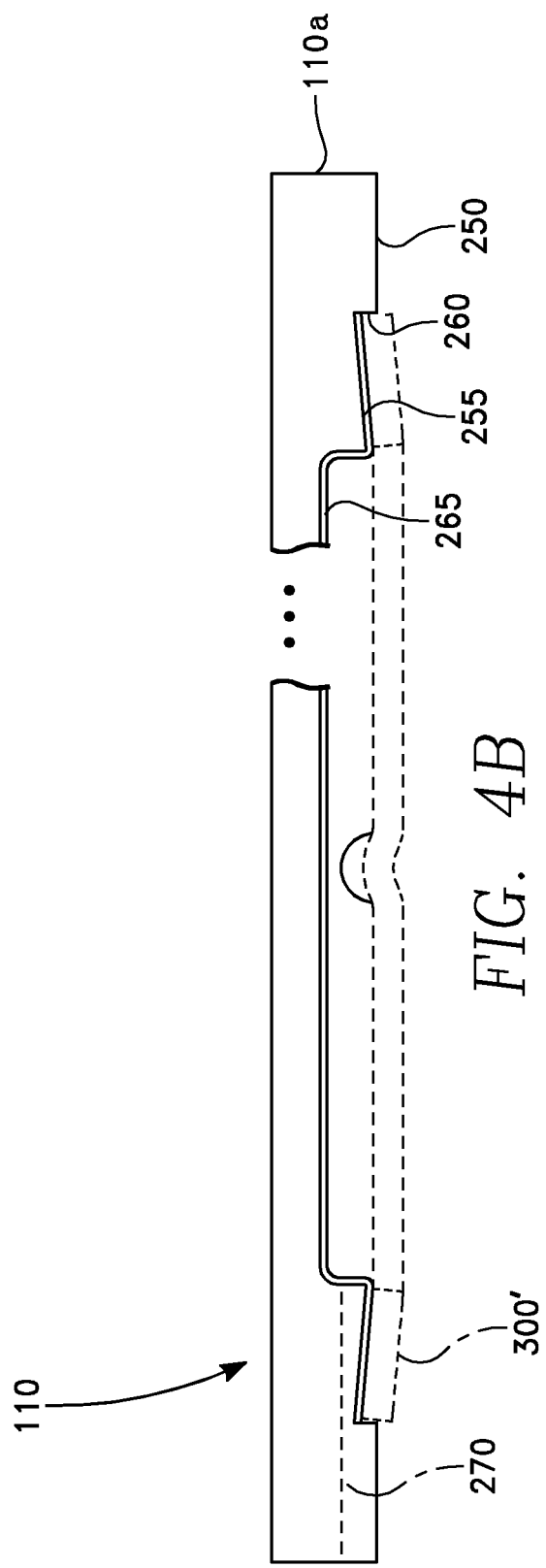

WATER-TIGHT COMPARTMENT WITH REMOVABLE HATCH AND TWO-SIDED GEL SEAL FOR MULTIPLE CONDUIT ACCESS

CROSS-REFERENCE TO RELATED APPLICATIONS

This application is a continuation of U.S. patent application Ser. No. 15/248,929, filed Aug. 26, 2016, by Ronald H. Olch et al., now U.S. Pat. No. 10,094,165, Issued Oct. 9, 2018 entitled WATER-TIGHT COMPARTMENT WITH REMOVABLE HATCH AND TWO-SIDED GEL SEAL FOR MULTIPLE CONDUIT ACCESS, hereby incorporated by reference in its entirety, which is a continuation of U.S. patent application Ser. No. 14/239,749, filed Sep. 9, 2014, by Ronald H. Olch et al., now U.S. Pat. No. 9,476,251, Issued Oct. 25, 2016 entitled WATER-TIGHT COMPARTMENT WITH REMOVABLE HATCH AND TWO-SIDED GEL SEAL FOR MULTIPLE CONDUIT ACCESS, hereby incorporated by reference in its entirety, which is a 371 National filing of PCT/US2012/042673, by Ronald H. Olch et al., filed Jun. 15, 2012, hereby incorporated by reference in its entirety, which claims benefit of U.S. Provisional Application Ser. No. 61/525,489 filed Aug. 19, 2011 entitled WATER-TIGHT COMPARTMENT WITH REMOVABLE HATCH AND TWO-SIDED GEL SEAL FOR MULTIPLE CONDUIT ACCESS, by Ronald H. Olch, et al., hereby incorporated by reference in its entirety.

BACKGROUND

Aircraft and water vessels ("craft") containing on-board electronics can require accessible water-tight compartments to house, for example, on-board electronic components. As employed herein, the term "water-tight" is understood to refer to resistance to diffusion or flow of liquid or gas molecules through a boundary or envelope, the gas being oxygen or air, or the liquid being water, for example. Such a water-tight compartment typically is enclosed by a water-proof envelope, and includes a removable hatch that is tightly fastened over the top of the compartment. It is desirable that the hatch may be removed and re-installed repeatedly, while attaining a water-tight or air-tight seal with the compartment upon each re-installation. The outermost surface of the hatch is typically flush with the outer surface of the craft, to present an aerodynamically smooth overall surface. Such a water-tight compartment may have conduits passing between the interior of the water-tight compartment and other locations on the craft external of the water-tight compartment. Each conduit may accommodate various wires, fiber optic cables and tubes. This enables communication between the electronics contained inside the water-tight compartment and other elements on the craft. Each such conduit must penetrate the water-proof envelope of the water-tight compartment, and therefore entails a risk of leakage around the interface between the conduit and the water-proof envelope. This is particularly true in cases where a water landing cools the interior of the water-tight compartment, thereby creating a vacuum that pulls moisture in through any small voids that may exist at the interface between the water-proof envelope and any of the conduits passing through the water-proof envelope. Such problems can be addressed by using a special mechanical seal fitting at each one of the conduits. Such an approach may be undesirable due to the complexity, cost and weight entailed in such mechanical seal fittings. What is needed is a way of preventing leakage through the water-tight envelope around the various conduits without requiring special mechanical seal fittings.

SUMMARY OF THE INVENTION

An accessible compartment is provided in the body of a craft such as an aircraft or water craft, the body having an exterior body surface, the sealed compartment comprising a side wall and a floor defining a compartment interior, a compartment sealing surface at a top edge of the side wall, and a hatch body with a hatch sealing surface facing the compartment sealing surface. One or more elongate communication elements lie adjacent the compartment sealing surface and extend into the compartment interior from locations outside of the compartment interior. A first sealing gasket is between the compartment sealing surface and the hatch sealing surface and comprises a first elastically conformable layer. The compartment further includes hatch-to-compartment fastening structure. In an embodiment, the first gasket is between the compartment sealing surface and the elongate communication member, the compartment further comprising a second gasket between the hatch sealing surface and the elongate communication member, the second gasket comprising a second elastically conformable layer. In an embodiment, a first non-adhesive layer covers the first elastically conformable layer and a second non-adhesive layer covers the second elastically conformable layer. In an embodiment, a sloped portion of the compartment sealing surface and a sloped portion of the hatch sealing surface are ramped with respect to each other so as to open away from each other along a direction away from the compartment interior. In an embodiment, the conformable material has a conformability corresponding to an exclusion size on the order of a liquid molecule or a gas molecule. In an embodiment, the gasket comprises an underlying gasket attached to the compartment sealing surface and an overlying gasket attached to the hatch sealing surface.

In accordance with another aspect, an accessible sealable compartment in a body having an exterior body surface comprises a compartment interior and a compartment sealing edge adjacent a top edge of the compartment interior; a hatch body having a hatch sealing surface congruent with and facing the compartment sealing surface; and a pair of interlocking gaskets comprising a first interlocking gasket on the compartment sealing edge and a second interlocking gasket on the hatch sealing edge, the first and second interlocking gaskets comprising an elastically deformable material. In an embodiment, the compartment further comprises one or more channels in the compartment sealing edge and underlying the first interlocking gasket, the channels being in communication with the compartment interior; and one or more elongate communication members having respective portions lying in the respective channels, the elongate communication members extending into the compartment interior from locations outside of the compartment interior. In an embodiment, the compartment further comprises a sealing gasket in each channel surrounding the respective elongate communication member, the sealing gasket comprising an elastically conformable material. In an embodiment, the sealing gasket comprises a first gasket underlying the elongate communication member and a second gasket overlying the elongate communication member. In an embodiment, the elastically conformable material comprises a viscous gel. In an embodiment, the elastically conformable material has a conformability corresponding to an exclusion size on the order of a liquid molecule such as water or a gas molecule such as oxygen. In an embodiment, the channel has a width corresponding to a diameter of the elongate communication member. In an embodiment, one of the interlocking gaskets comprises a pair of elongate outwardly extending barbs and the other of the interlocking gaskets comprises a pair of elongate inwardly extending barbs matable with the pair of elongate outwardly extending barbs.

BRIEF DESCRIPTION OF THE DRAWINGS

So that the manner in which the exemplary embodiments of the present invention are attained and can be understood in detail, a more particular description of the invention, briefly summarized above, may be had by reference to the embodiments thereof which are illustrated in the appended drawings. It is to be appreciated that certain well known processes are not discussed herein in order to not obscure the invention.

FIG. 4B is a side view corresponding to FIG. 4A.

Figure 1:
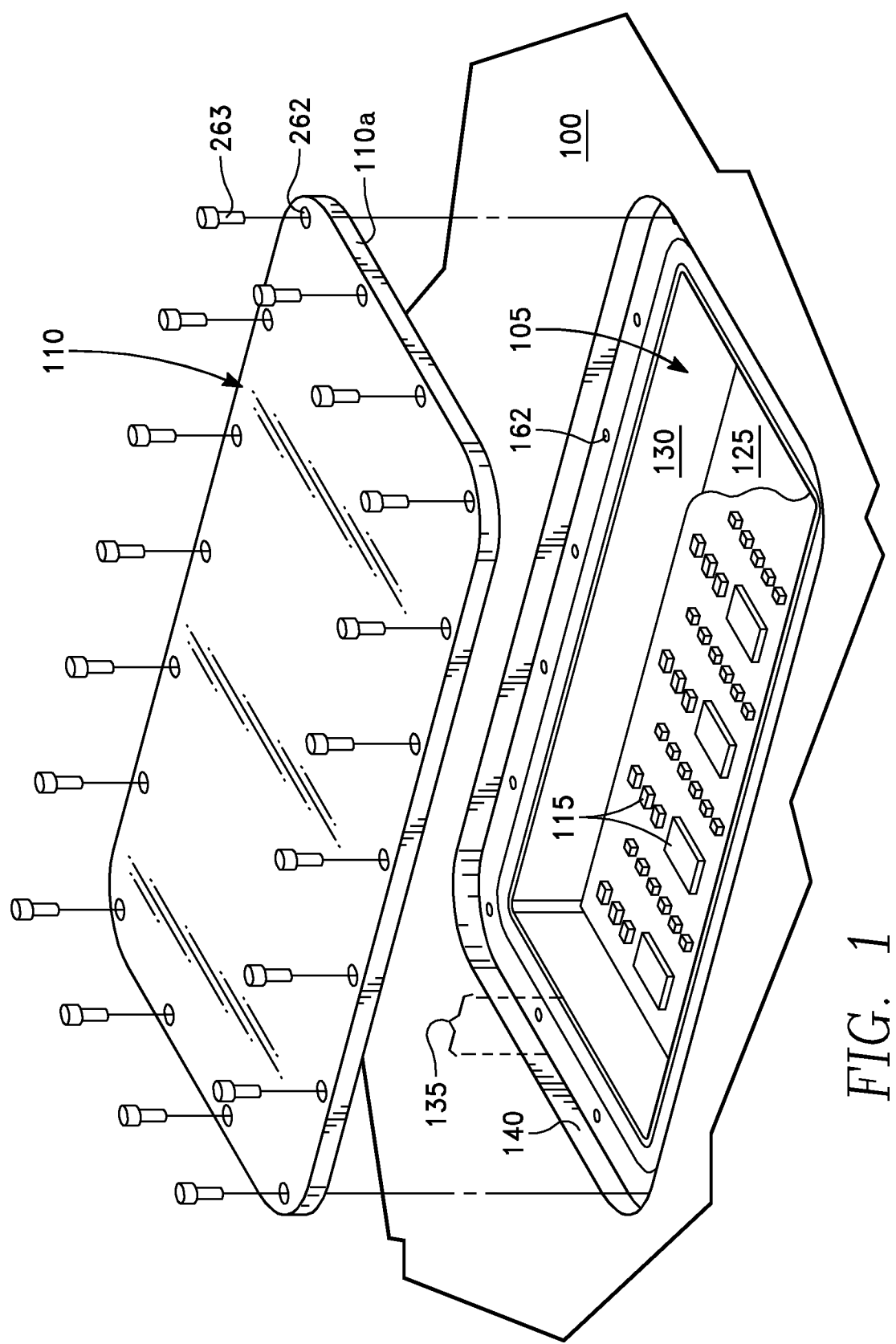
FIG. 1 is a perspective view of a sealable compartment including a removable hatch, in accordance with an embodiment.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

Figure 2:
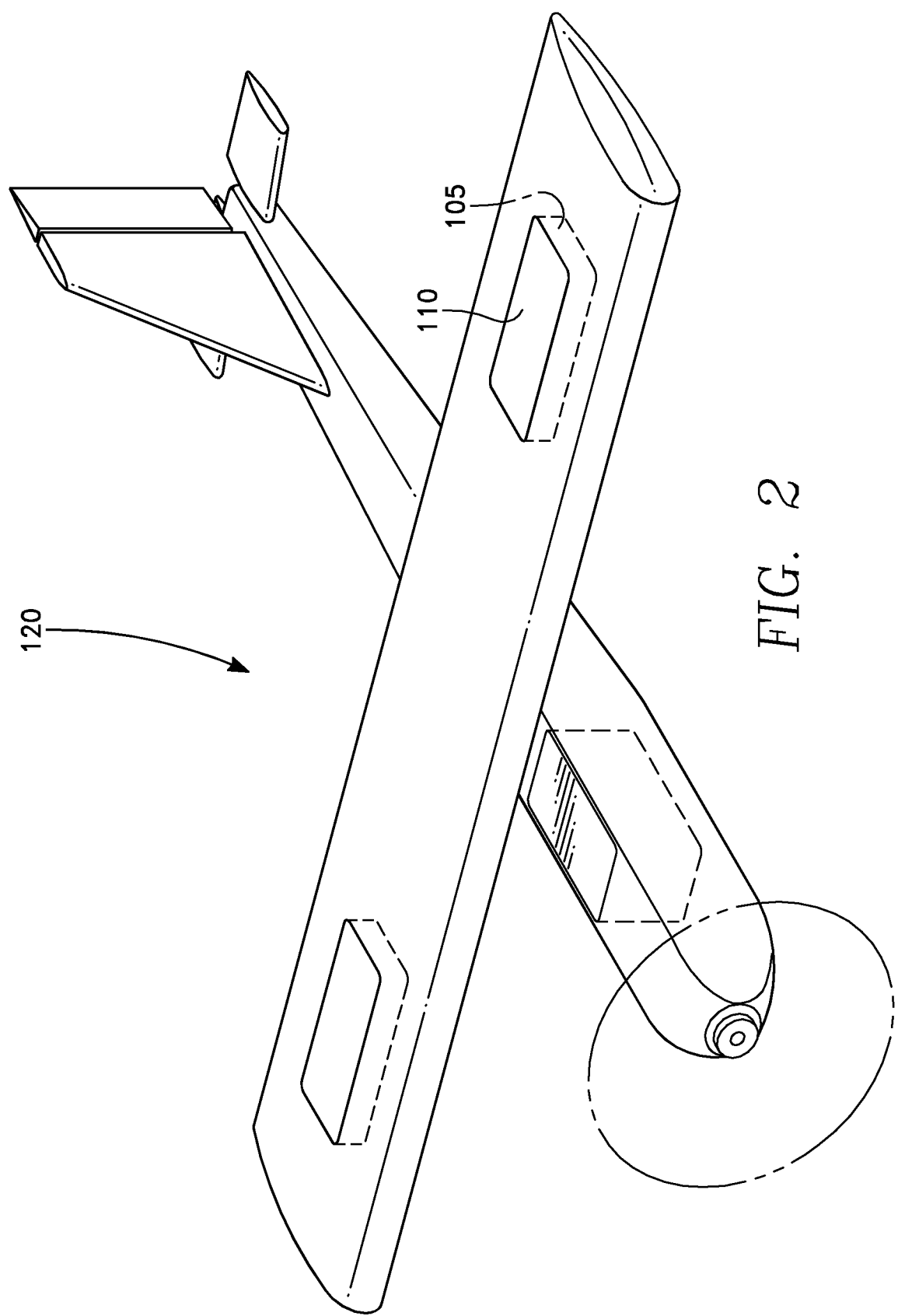
FIG. 2 is a perspective view of the compartment of FIG. 1 on the wing of an aircraft.

FIG. 1 is an orthographic view of a surface 100 of a craft (such as an aircraft or vessel) having a water-tight compartment 105 sealed in accordance with one embodiment described below in greater detail. A removable hatch 110 provides access to the compartment 105 for servicing various electronic components 115 contained in the compartment 105. FIG. 2 depicts an example of how the compartment 105 and hatch 110 may be provided on the wing of an aircraft 120. The external surface of the hatch 110 is flush with the surface of the wing. The compartment interior is defined by a floor 125 and a sidewall 130. The sidewall 130 is surrounded by a shoulder 135 whose surface is depressed below the outer surface 100 to form a step 140. The surface of the shoulder 135 forms an elongate strip that follows the outline of the compartment 105. In the illustrated embodiment, the compartment 105 is generally rectangular, and the surface of the shoulder 135 forms a rectangular annulus. If the compartment 105 were circular or ellipsoidal, then the shoulder 135 would be in the shape of a circular or ellipsoidal annulus, for example. The height and shape of the step 140 matches (or approximately matches) the thickness of outer edge 110a of the hatch 110. Referring to the enlarged view of FIG. 3A, the shoulder 135 is divided into an outer surface or strip 150 and an inner surface or strip 155 depressed below the outer surface 150 to form a ridge 160 between them. As will be explained later in this specification, the ridge 160 exists because the inner surface 155 is ramped relative to the outer surface 150. The ridge 160 is a generally vertical surface facing the interior of the compartment 105. In the illustrated embodiment, the outer and inner surfaces 150, 155 are each a generally rectangular annulus, in accordance with the shape of the shoulder 135. Plural fastener openings 162 are provided through the outer surface 150 of the shoulder 135.

Figure 3A:
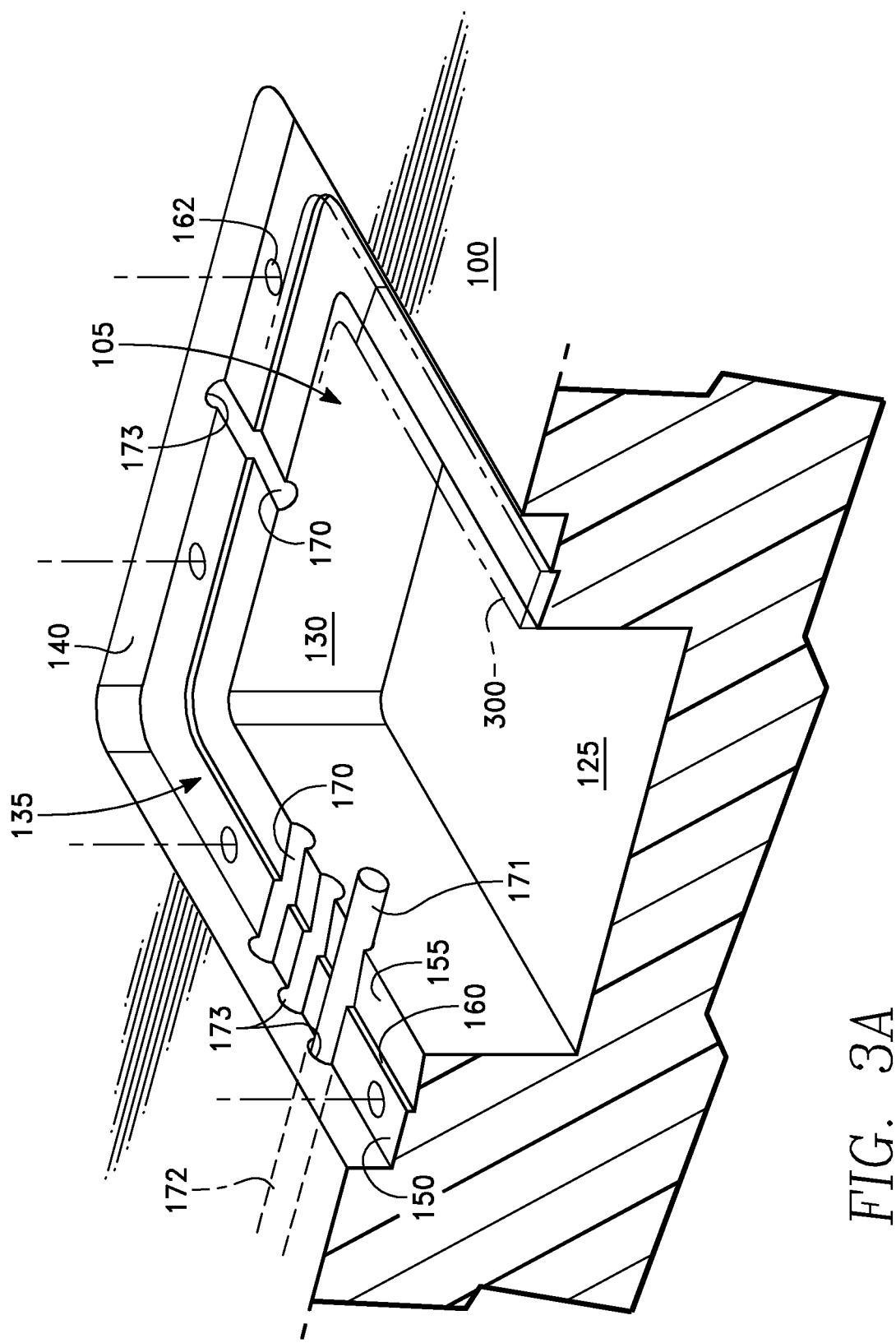
FIG. 3A is a cross-sectional perspective view of the compartment of FIG. 1.
Figure 3B:
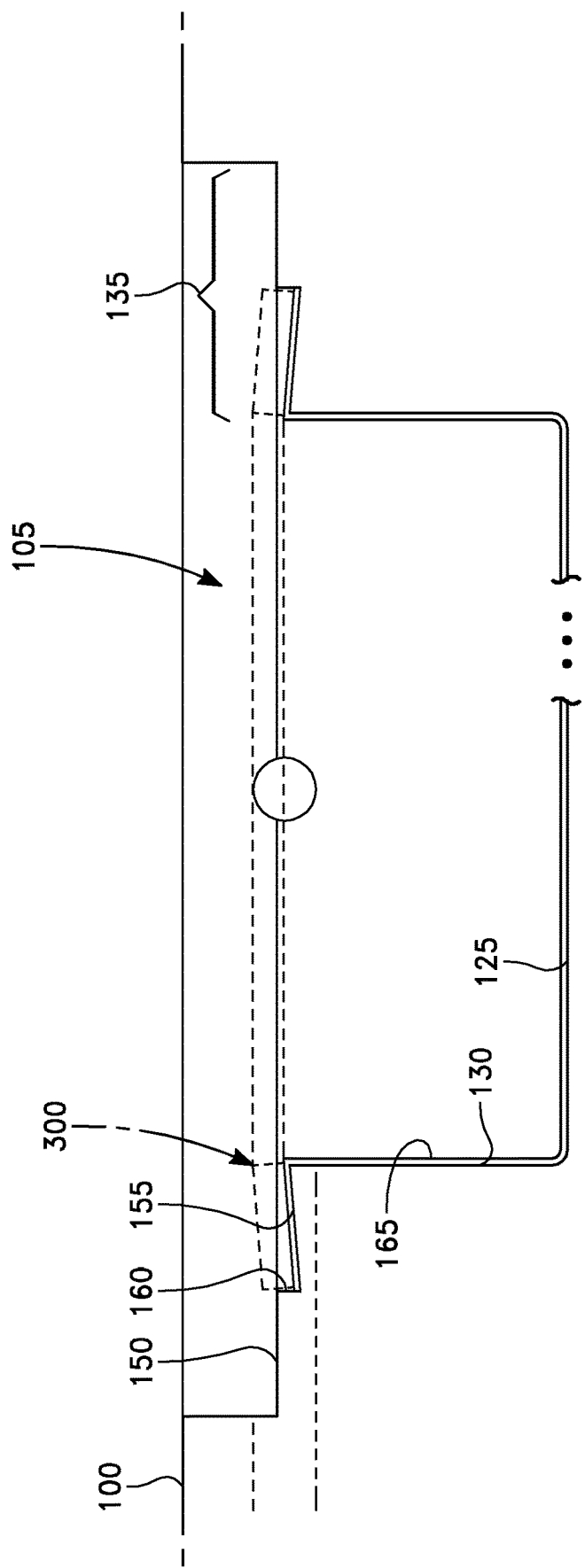
FIG. 3B is a cross-sectional side view corresponding to FIG. 3A.

The body of the craft forming the surface 100 and the surfaces of the floor 125 and the sidewall 130 may be formed of a composite material such as a molecular fiber matrix and fiberglass composite, which may be a Kevlar® material. Kevlar® is a registered trademark of E. I. du Pont de Nemours and Company, of Wilmington, Del. and the Kevlar® material is offered through a website of that corporation. Such a material may be water penetrable. Therefore, as shown in FIG. 3B, a thin waterproof layer or film 165 is deposited on the interior surfaces of the compartment, including the floor 125 and sidewall 130, so that the layer 165 adheres to the underlying surfaces. This seals the floor 125 and side wall 130 of the compartment 105. The film 165 may possibly extend over the top of the sidewall 130 and onto the interior surface 155 of the shoulder 135. Otherwise, the film 165 may extend to the top edge of the sidewall 130. The film 165 functions as a water-proof envelope of the compartment 105 and may be formed of a complaint material such as Surlyn® material. Surlyn® is a registered trademark of E. I. du Pont de Nemours and Company, of Wilmington, Del. and the Surlyn® material is offered through a website of that corporation.

Referring again to FIG. 3A, conduits for wires, optical fibers, tubes or the like passing into the compartment 105 are accommodated by channels 170 formed in the outer and inner surfaces 150, 155 of the shoulder 135. Each individual channel 170 is transverse to the path of the shoulder 135 and may be sized to accommodate a single elongate communication element. Each elongate communication element 171 may be a flexible member such as a wire conductor, optical fiber, tube, conduit or the like. For example, the depth of each channel 170 may be about one half of the diameter or thickness of the elongate communication element 171 to be accommodated. As will be described below in this specification, the hatch 110 has similar channels in registration with the channels 170 in the shoulder 135, each channel in the hatch 110 having a similar depth. While FIG. 3A depicts examples in which the flexible members 171 are elongate and/or cylindrical, the flexible members may be wide and planar in shape, such as a ribbon cable, or flat rectangular items such as flex circuits as well as single-conductor cables, tubes, and the like. In each case, the channels are shaped appropriately, to be congruent with the wide planar shape as required.

Ingress of the elongate communication element 171 into the body of the craft is provided by an internal passageway 172 terminated at a hole or opening 173 in the vertical wall of the step 140. The opening 173 of the internal passageway 172 is in registration with the channel 170. Respective internal passageways 172 and holes 173 are provided for the respective channels 170, as depicted in FIG. 3A. Each hole 173 has a diameter of about twice the depth of the channel, and the channel 170 is aligned with the bottom half of the hole 173. As will be described below in this specification, the top half of the hole 173 faces a corresponding channel in the hatch 110.

Figure 4A:
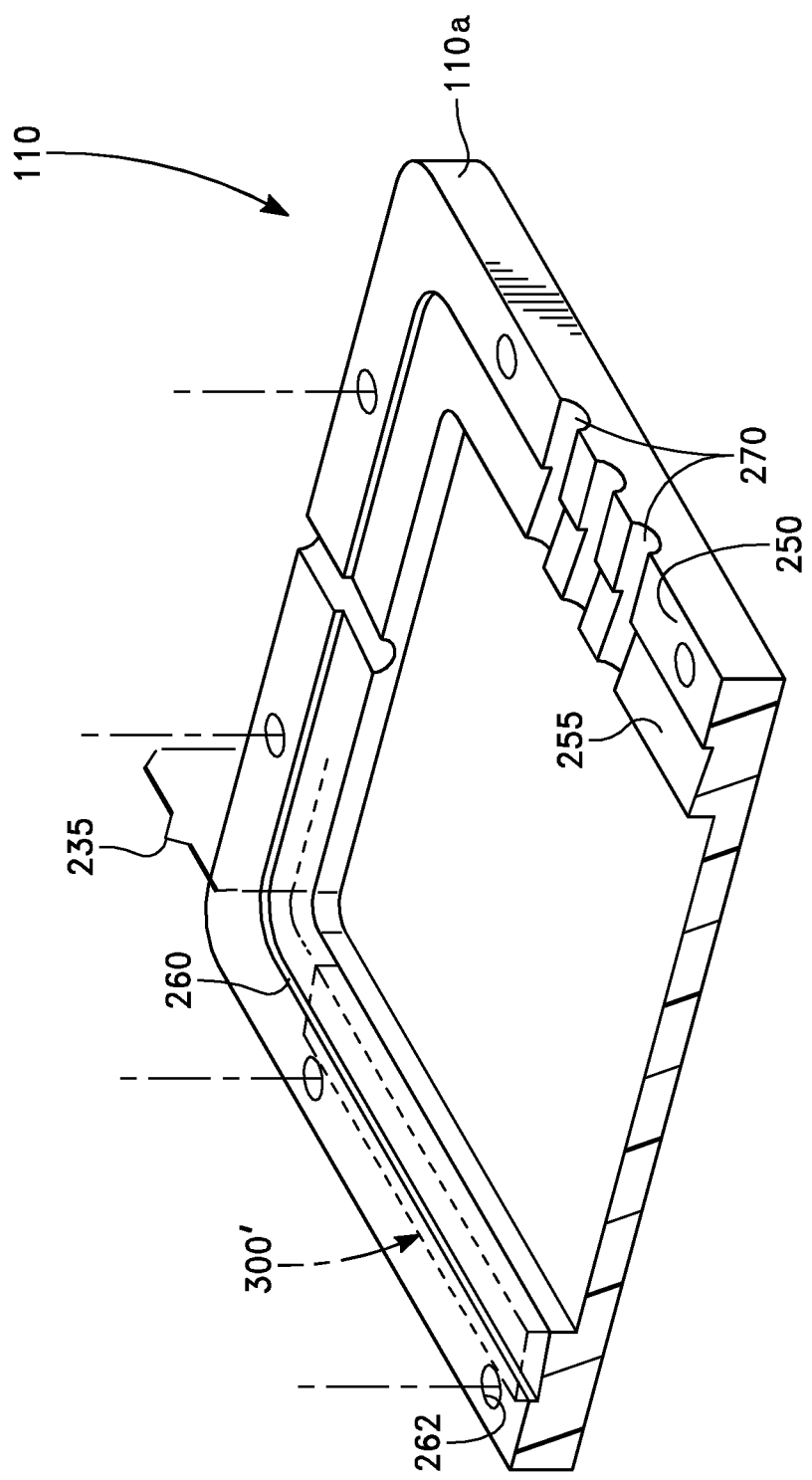
FIG. 4A is a cross-sectional perspective view of the removable hatch of FIG. 1.

Referring to FIG. 4A, the interior surface of the hatch 110 has a structure mirroring the structure of the compartment 105 described above with reference to FIG. 3A. Specifically, the hatch edge 110a surrounds a hatch shoulder 235 formed in the interior (bottom) surface of the hatch 110, the shoulder 235 of the hatch 110 being congruent with the shoulder 135 of the compartment 105. The shoulder 235 is divided into an outer surface or strip 250 and an inner surface or strip 255 depressed below the outer surface 250 to form a ridge 260 between them. The ridge 260 is a generally vertical surface facing the interior of the compartment 105. The outer surface 250 accommodates fastener openings 262. Fasteners 263, such as threaded screws, may pass through the openings 262 in the hatch 110 and be threadably engaged in the openings 162 in the body of the compartment 105, as seen in FIG. 1.

The body of the hatch 110 may be formed of a composite material such as a molecular fiber matrix and fiberglass composite. Such a material may be water penetrable. Therefore, as shown in FIG. 4B, a thin waterproof layer or film 265 is deposited on the interior surfaces of the hatch 110 so that the film 265 adheres to the underlying surfaces. The film 265 may possibly extend onto the interior surface 255 of the shoulder 235. Otherwise, the film 265 may extend to the inner edge of the inner surface 255. The film 265 functions as a part of a water-proof envelope of the compartment 105 when the hatch 110 is fastened in place over the compartment 105 and may be formed of a compliant material such as the Surlyn® material referred to above.

Referring again to FIG. 4A, conduits for elongate communication elements 171 passing into the compartment 105 are accommodated by channels 270 formed in the outer and inner surfaces 250, 255 of the shoulder 235 of the hatch 110. Each individual channel 270 is in registration with a corresponding channel 170 in the shoulder 135 of the compartment 105 of FIG. 3A, and the corresponding channels match one another in size. For example, the depth of each channel 270 may be slightly less than about one half of the diameter or thickness of the elongate communication element to be accommodated. The channel 170 faces the bottom half of a corresponding one of the holes 173 in the step 140, while the channel 270 faces the top half of the corresponding hole 173. Thus, the diameter of the hole 173 may be on the order of about twice the depth of each channel 170, 270. The depths of the matching channels 170 and 270 are preferably the same, so that a conduit or wire accommodated within a pair of facing channels 170, 270 experiences a top-to-bottom even distribution of pressure when the hatch 110 is fastened onto the top of the compartment 105.

Figure 5:
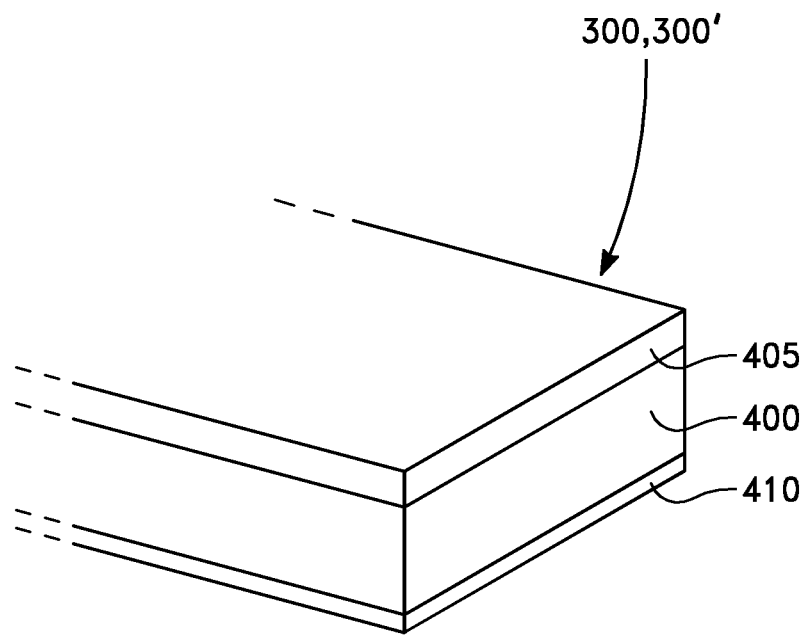
FIG. 5 is a perspective view of a layered structure of a sealing gasket in the embodiment of FIG. 1.
Figure 6:
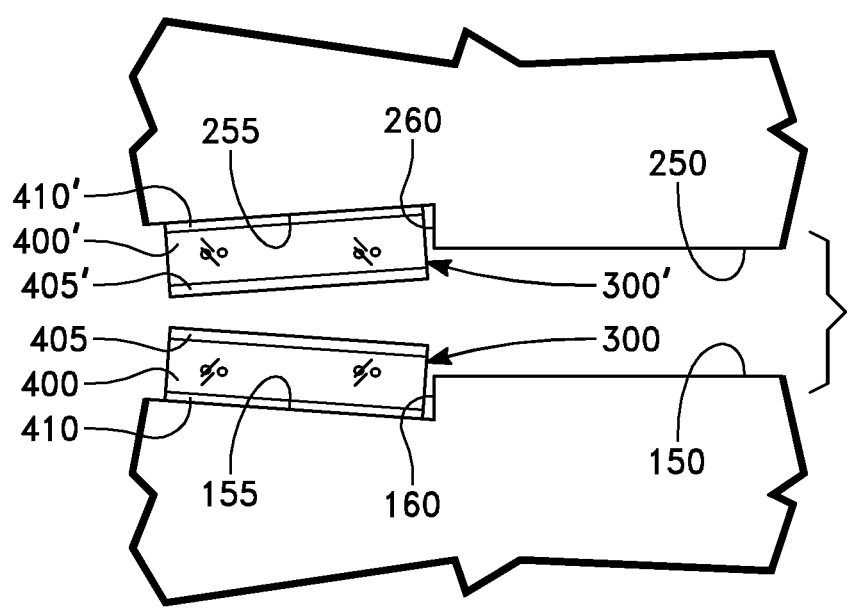
FIG. 6 is a cut-away side view of portion of an assembly of the compartment and removable hatch of FIG. 1.

Referring again to FIG. 3A, a sealing gasket 300 comprising a highly conformable layer such as a silicone gel is laid over the inner surface 155. Referring to FIG. 4A, an identical sealing gasket 300' is laid over the inner surface 255 of the hatch 110. The sealing gaskets 300, 300' may be of a highly conformable or viscous material, such as a highly conformable silicone gel material. Such a seal is sold by Dow Corning Corporation of Midland, Mich. under the product name "Dow Corning gel seal", specifically the gel seal 1030 product. The structure of such a seal or gasket is depicted in FIG. 5, and includes a gel layer 400 of a viscous or highly conformable and adhesive gel material, a non-adhesive top layer 405 formed of an open-cell foam material, for example. Optionally, an adhesive backing may be provided as a bottom layer 410. The non-adhesive top layer 405 enables the hatch 110 to be removed from the compartment 105. As shown in FIG. 6, for the sealing gasket 300, the top non-adhesive layer 405 covers the gel layer 400 and is the exposed surface of the gasket 300, and the adhesive backing layer 410 contacts the inner surface 155. For the sealing gasket 300', a top non-adhesive layer 405' covers a gel layer 400' and is the exposed surface of the gasket 300', and an adhesive backing layer 410' contacts the inner surface 255. The non-adhesive layers 405 and 405' enables the hatch to be removed from the compartment by preventing the two sealing gaskets 300 and 300' from bonding together. This is because the foam layers 405 and 405' will not adhere to each other as the gel layers 400 and 400' would in absence of the non-adhesive layers 405 and 405'.

It is believed that the ability of the gel layers 400 and 400' to form a perfect water-tight or air-tight seal in a confined space with corners and edges is attributable to its ductility. A measure of its ductility is the elongation of the material. The Dow Corning gel seal material is believed to have an elongation of 150% or greater. Thus, in one aspect, the gel layers 400 and 400' may be formed of a deformable material having an elongation of at least 150% or greater.

Referring to FIG. 6, the ridge 160 acts as a positioning reference for the gasket 300, resisting migration of the gasket 300 toward the periphery. The ridge 260 acts as a positioning reference for the gasket 300', resisting migration of the gasket 300' toward the periphery. The height of the ridge 160 determines the distance by which the gasket 300 is compressed when the hatch 110 is fastened over the compartment 105. The compression distance is the difference between the thickness of the gasket 300 and the height of the ridge 160. The height of the ridge 260 determines the distance by which the gasket 300' is compressed when the hatch 110 is fastened over the compartment 105. The compression distance is the difference between the thickness of the gasket 300' and the height of the ridge 260.

Figure 7A:
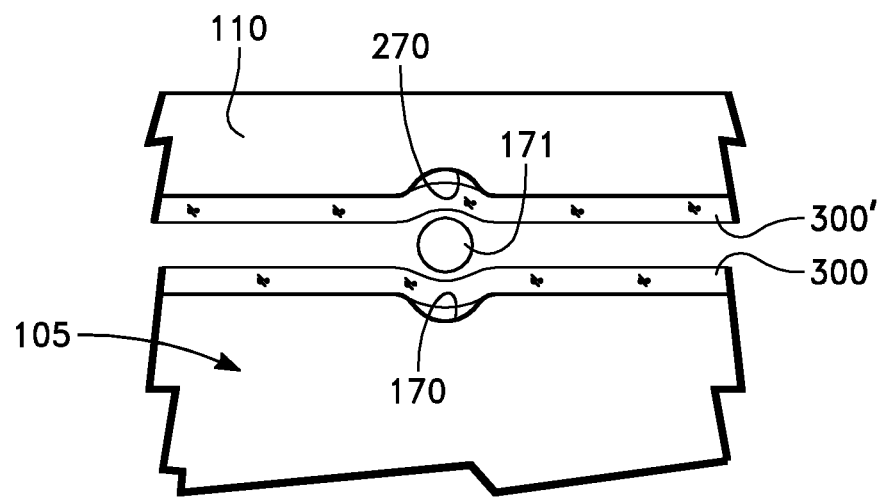
FIG. 7A is a cut-away end view of a portion of the assembly of FIG. 1 in the vicinity of a channel and elongate communication element before the removable hatch is fully pressed to the compartment.
Figure 7B:
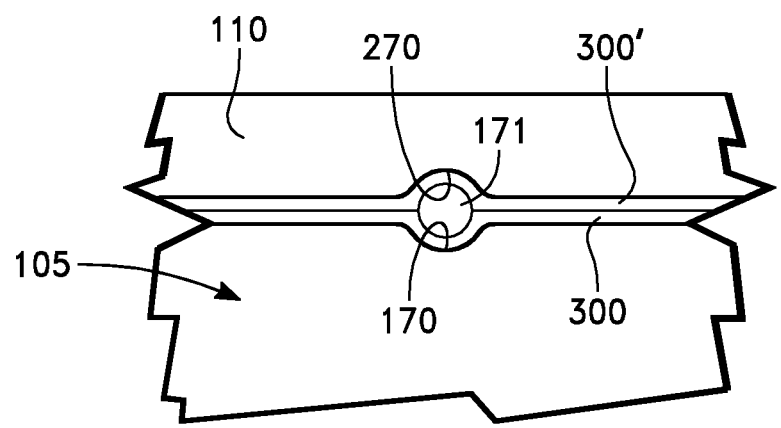
FIG. 7B is a cut-away end view of a portion of the assembly of FIG. 1 in the vicinity of a channel and elongate communication element when the removable hatch is fully pressed to the compartment.

Referring to FIGS. 7A and 7B, it is believed that the conformability of each sealing gasket 300, 300' is so great that, as the hatch 110 is compressed toward the compartment 105 (FIG. 7A), firmly pressing the opposing surfaces together (FIG. 7B), the sealing gaskets 300, 300' fill in spaces or voids between the elongate communication element 171 and the interior surfaces of the channels 170, 270, so that there remains no voids of a sufficiently large size for a molecule of a gas (e.g., oxygen) or of a liquid (e.g., water) to pass through. The ability of each sealing gasket 300, 300' to conform to (and fill) the volume defined between the elongate communication element 171 and the interior surfaces of the facing channel 170, 270 is referred to herein as the conformability of the gaskets 300 and 300'. The conformability may be defined by the size of the smallest molecule excluded by the seal formed by the gaskets 300 and 300' around the elongate communication element 171. This size may be referred to as the exclusion size, and characterizes the conformability of the material comprised within the gaskets 300, 300'. In one embodiment, the exclusion size is equal to or smaller than the size of a water molecule, so that the seal formed by the gaskets 300 and 300' is water-tight. In another embodiment, the exclusion size is equal to or smaller than the size of an oxygen gas molecule, so that the seal is air-tight. Optionally, the water-tightness or air-tightness may be exhibited for a limited period of time (for example, a matter of hours in a range of one to 24 hours), which may vary depending upon the requirements of the system designer. Or, the water-tightness of air-tightness is exhibited for an undefined (unlimited) period of time.

The gel layer 400 and the non-adhesive top layer 405 fill the voids surrounding each elongate communication element 171 by deforming elastically. Such elastic deformation enables each gasket 300, 300' to relax whenever the hatch 110 is removed and to again conformability fill the voids surrounding each conduit when the hatch 110 is re-installed, so that the hatch may be removed and re-installed repetitively to attain a perfect seal upon each re-installation of the hatch 110 over the compartment 105.

High conformability, with exclusion size on the order of a water molecule or oxygen gas molecule, is exhibited by a silicone gel material, such as the Dow Corning gel seal material referred to above. In one embodiment, the sealing gaskets 300 and 300' are each strips of Dow Corning gel seal 3010 material referred to above. However, any other suitable material satisfying the elastic conformability defined above may be employed for the gaskets 300 and 300'.

Referring still to FIGS. 7A and 7B, the deformation of the gaskets 300 and 300' around the elongate communication element 171 is determined by the respective depths of the channels 170 and 270. In an embodiment, each pair of facing channels 170, 270 are of the same depth, so that the opposing compressive forces of the gaskets 300, 300' against the elongate communication element 171 are the same. The distance by which the gaskets 300 and 300' are compressed around the elongate communication element 171 corresponds to the difference between the diameter (or thickness) of the elongate communication element 171 and the sum of the depths of the opposing channels 170 and 270.

Figure 8:
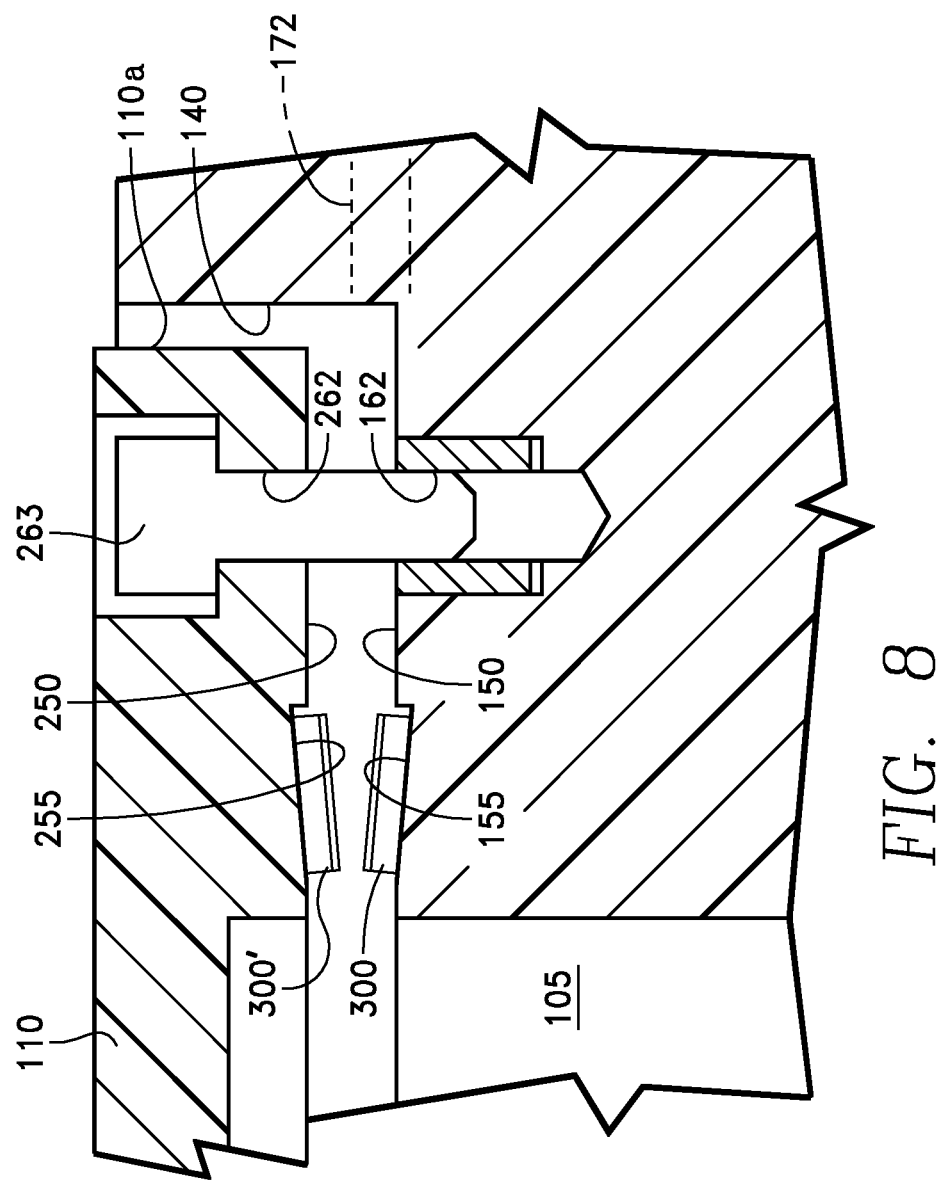
FIG. 8 is a side cross-sectional view corresponding to FIG. 7A.

In order to prevent migration of the gaskets 300, 300' toward the interior of the compartment 105, the inner surfaces 155, 255 are each sloped at an angle of about 5 degrees in opposite slopes so that the two surfaces 155, 255 ramp away from each other at a combined angle of 10 degrees in a radially outward direction, i.e., toward the periphery or step 140, as shown in the cross-sectional view of FIG. 8. The ramp angle of each of the inner surfaces 155, 255 may not necessarily be 5 degrees, but may lie in an appropriate range (e.g., from about 1 to 10 degrees). The ramp angle of the compartment inner surface 155 determines the height of the ridge 160. The ramp angle of the hatch inner surface 255 determines the height of the ridge 260. The gaskets 300, 300' are confined against migration in an inward direction toward the interior of the compartment 105 by the oppositely sloped inner surfaces 155, 255, and are confined against migration in the opposite (outward) direction by the ridges 160, 260. The ridges 160, 260 thus perform two functions, in that their heights determine the degree to which the gaskets 300, 300' are compressed upon closure of the hatch 110 over the compartment 105, and because they block migration of the gaskets 300, 300' in the outward direction.

Figure 7C:
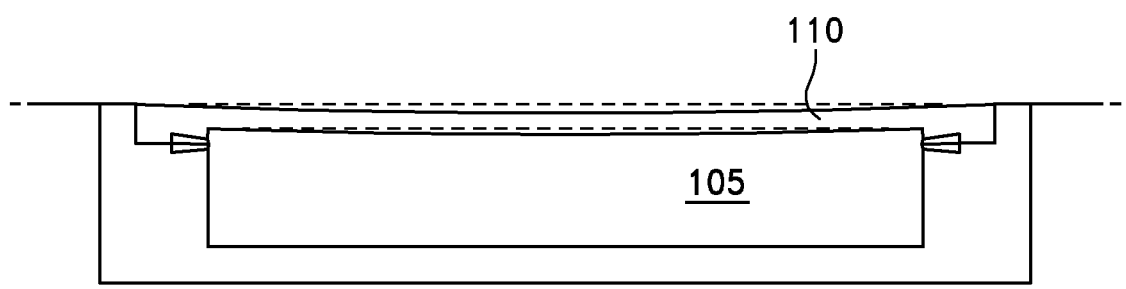
FIG. 7C is a side view corresponding to FIG. 7B.

As the hatch 110 pushes the viscous gaskets 300, 300' down the 5 degree ramps of the facing inner surfaces 155 and 255, the gaskets 300, 300' are wedged tighter into corners formed between the elongate communication element 171 and interior surfaces of the pair of facing channels 170 and 270, while the gaskets 300 and 300' are prevented from migrating toward or into the compartment 105. As depicted in FIG. 7C, if the compartment 105 experiences a vacuum, the hatch 110 deflects in such a manner that the oppositely ramped inner surfaces 155, 255 become even more sloped relative to one another, thereby pushing the gaskets 300, 300' more tightly into any corners or voids formed between the elongate communication element 171 and the interior surfaces of the pair of facing channels 170, 270, thus enhancing the sealing action of the gaskets 300, 300' in opposing the forces of such a vacuum.

Figure 9:
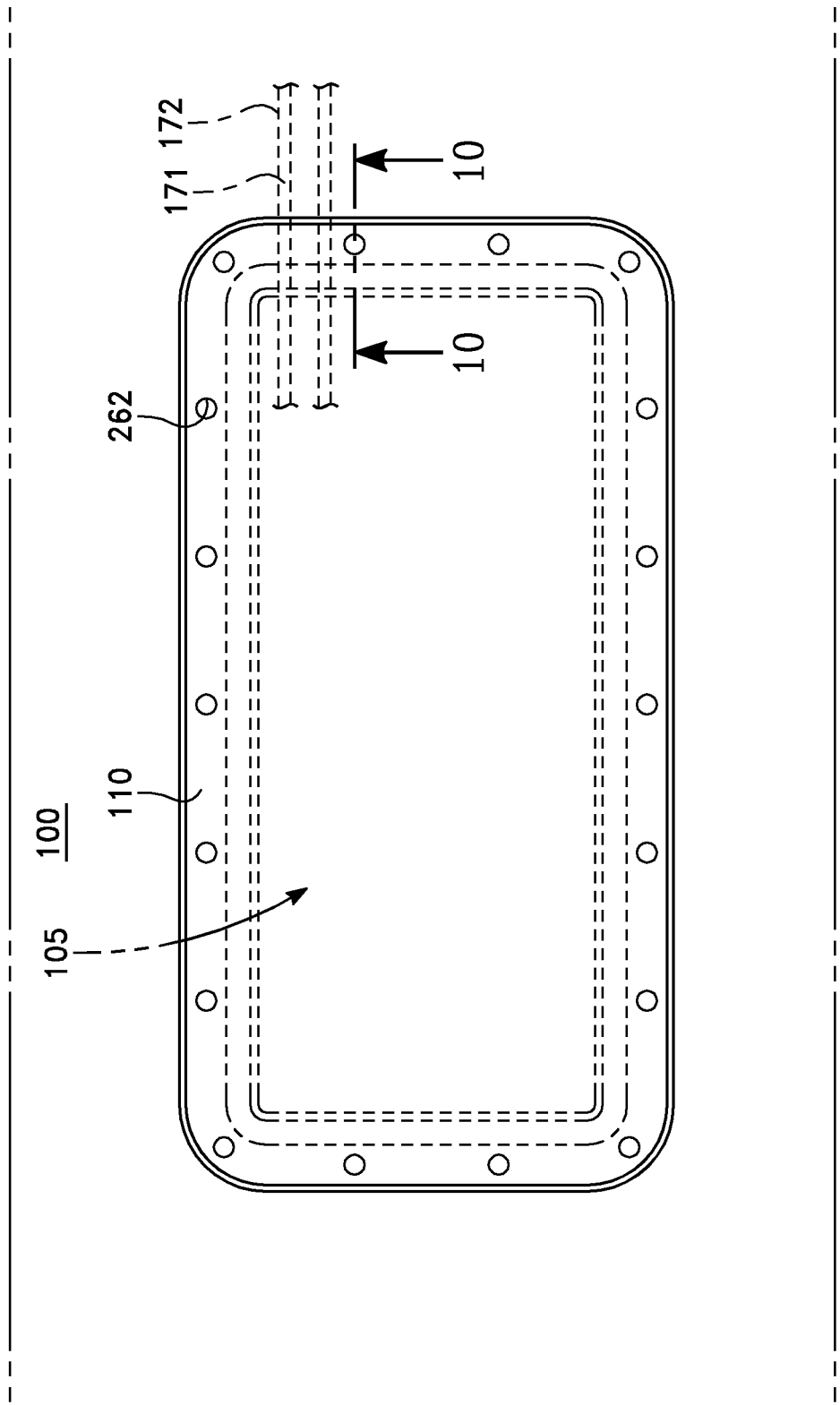
FIG. 9 is a plan view corresponding to FIG. 1.
Figure 10:
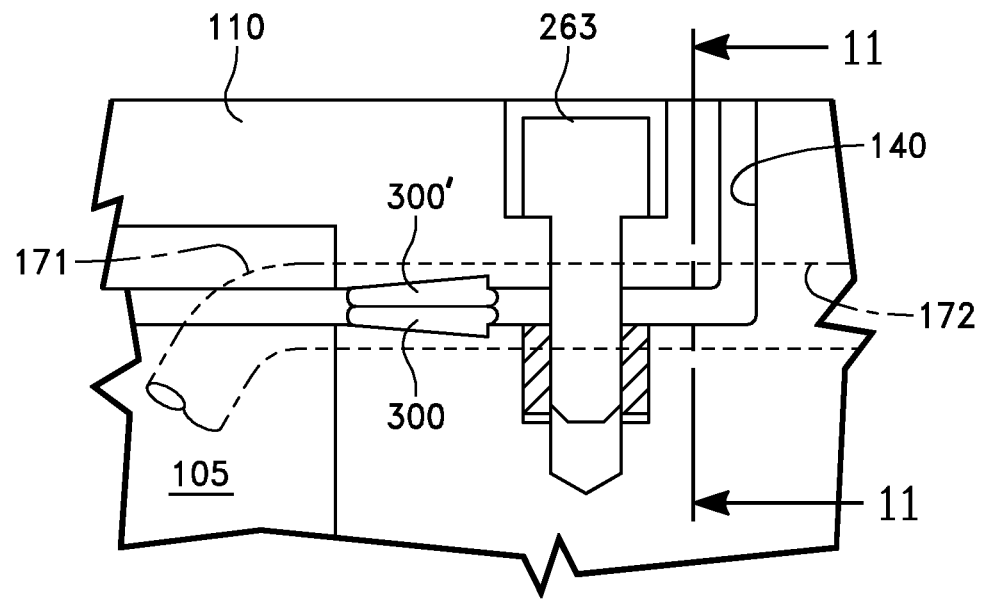
FIG. 10 is a cross-sectional view taken along lines 10-10 of FIG. 9.
Figure 11:
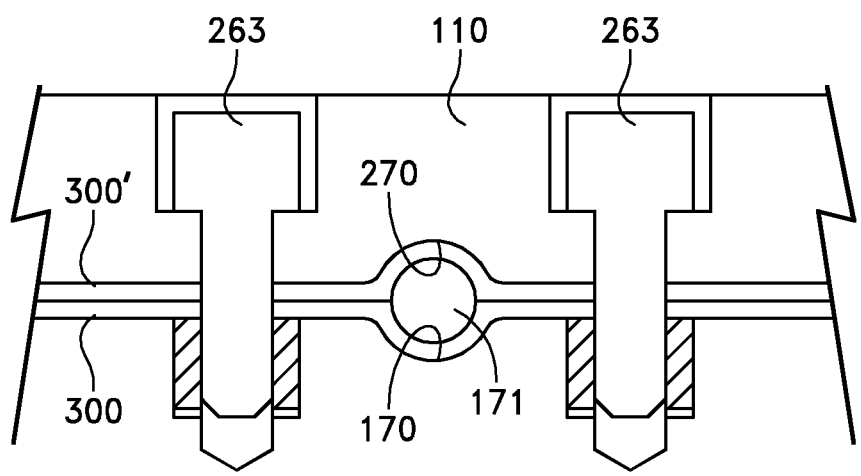
FIG. 11 is a cross-sectional view taken along lines 11-11 of FIG. 10.

A plan view of the closed assembly is shown in FIG. 9. FIGS. 10 and 11 are cross-sectional views taken at different locations noted in FIG. 9.

Figure 12A:
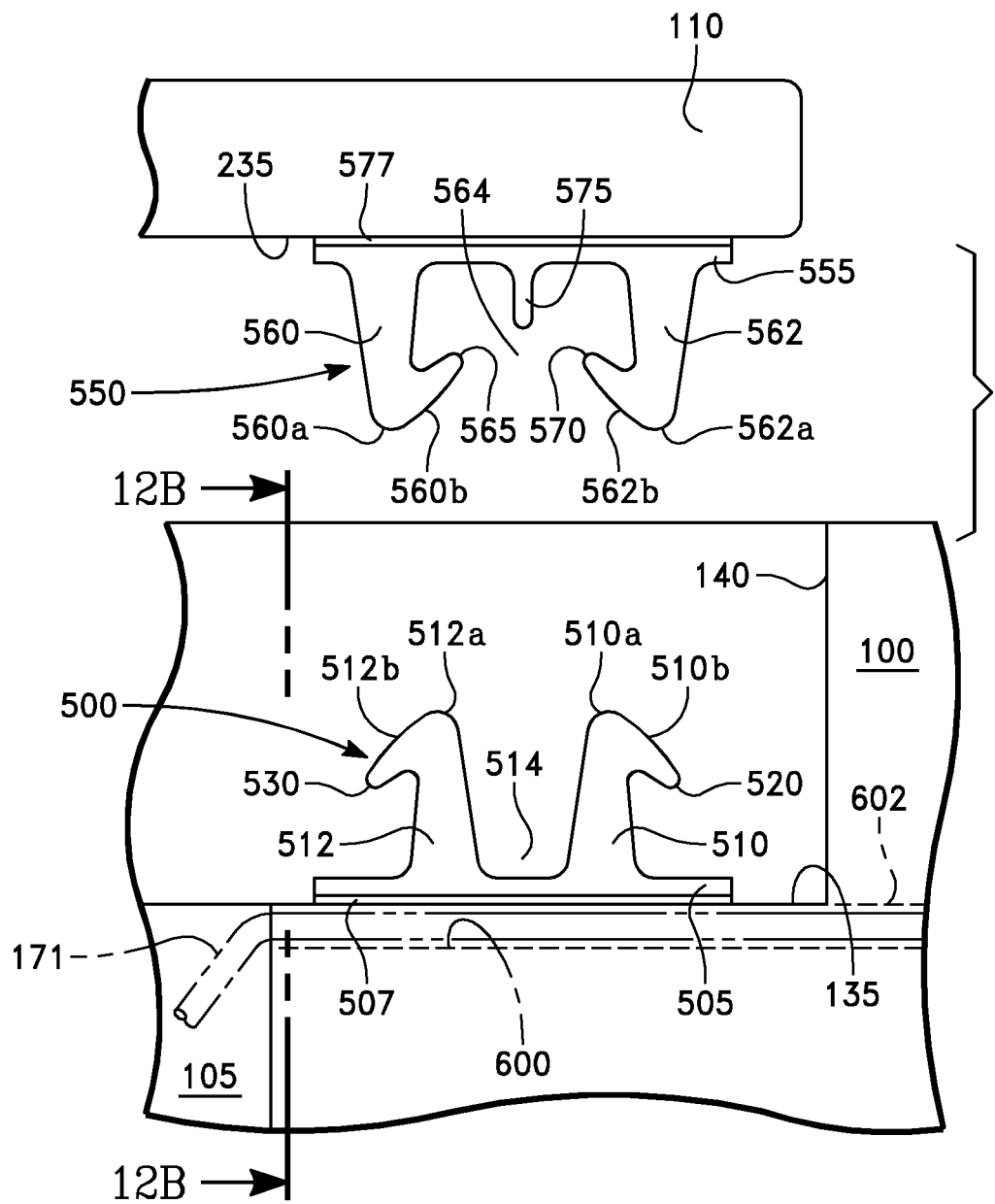
FIG. 12A is a cut-away end view of a second embodiment in a partially disassembled state.

Referring now to FIG. 12A, the fasteners 263 and fastener holes 162 and 262 of FIG. 1 may be replaced by a pair of interlocking gaskets, namely a bottom interlocking gasket 500 bonded to the surface of the shoulder 135 of the compartment 105, and a top interlocking gasket 550 bonded to the surface of the shoulder 235 of the hatch 110. The pair of interlocking gaskets 500 and 550 eliminate the need for the gel seal gaskets 300 and 300' and the associated fasteners of the embodiments described above. The shoulders 135 and 235 may be continuously flat and not sloped. In the illustrated embodiment, the bottom interlocking gasket 500 includes a base 505 having a bottom surface or a bottom adhesion layer 507 bonded to the surface of the shoulder 135. The bottom interlocking gasket 500 further includes a pair of ridges 510, 512 extending from the base 505 and separated by an inner gap 514. The ridge 510 is formed with a barb 520 pointed outwardly with respect to the gap 514, while the ridge 512 is formed with a barb 530 pointed outwardly with respect to the gap 514 and in a direction opposite to that of the barb 520. In the illustrated embodiment, the top interlocking gasket 550 includes a base 555 having a bottom surface or a bottom adhesion layer 557 bonded to the surface of the shoulder 235 of the hatch 110. The top interlocking gasket 550 further includes a pair of ridges 560, 562 extending from the base 555 in a direction toward the bottom interlocking gasket 500, and separated by an inner gap 564. A center alignment nub 575 may be provided in the gap 564. The ridge 560 is formed with a barb 565 pointed inwardly toward the gap 564, while the ridge 562 is formed with a barb 570 pointed inwardly toward the gap 564 and in a direction opposite to that of the barb 565.

The ridges 510, 512, 560 and 562 are terminated at respective apexes 510a, 512a, 560a and 562a defined by respective ramped surfaces 510b, 512b, 560b and 562b that slope downwardly from the respective apex 510a, 512a, 560a and 562a to the respective barb 520, 530, 565 and 570. As just described, in this embodiment, the bottom interlocking gasket 500 has a pair of outwardly facing barbs 520, 530 and the top interlocking gasket 550 has a pair of inwardly facing barbs 565, 570. However, in another embodiment this arrangement is reversed, so that the bottom interlocking gasket 500 has a pair of inwardly facing barbs while the top interlocking gasket 550 has a pair of outwardly facing barbs.

Figure 13:
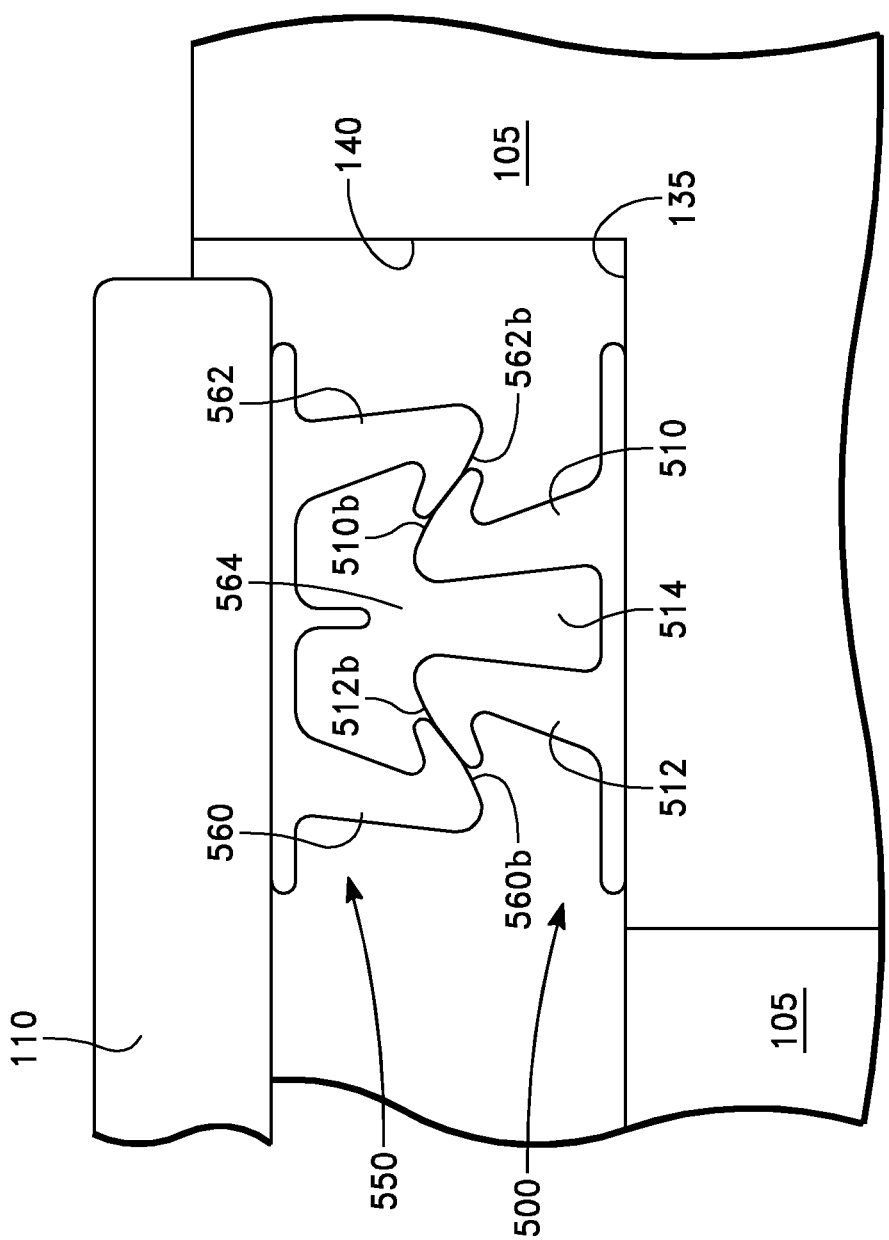
FIG. 13 is a cut-away end view depicting the embodiment of FIG. 12A in a partially assembled state.
Figure 14:
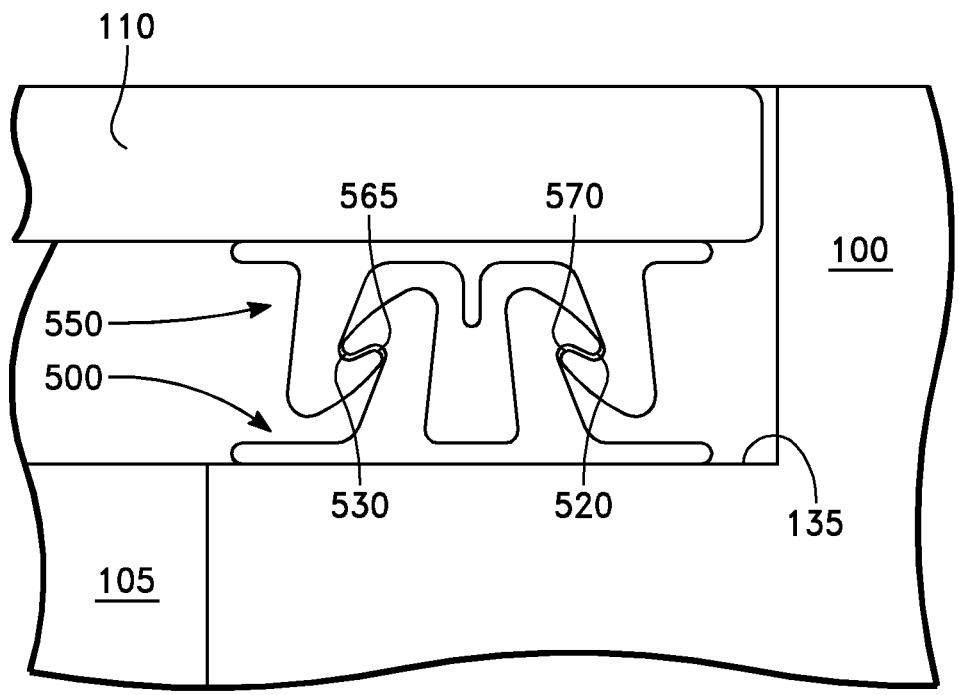
FIG. 14 is a cut-away end view depicting the embodiment of FIG. 12A in a fully assembled state.
Figure 15:
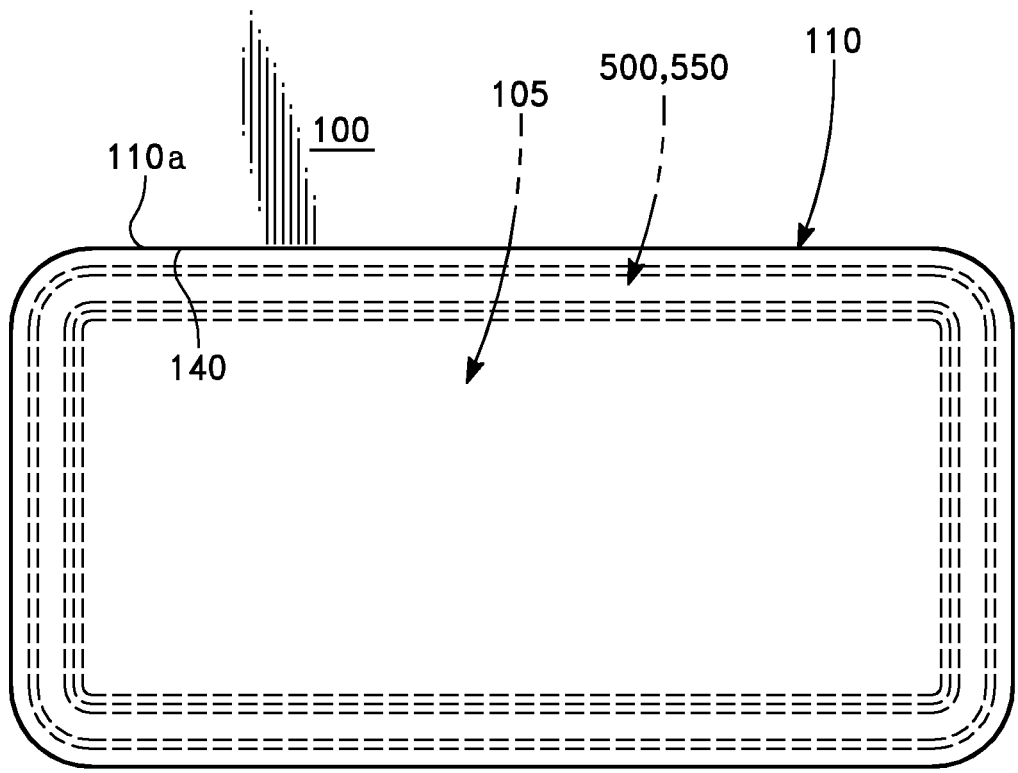
FIG. 15 is a top view corresponding to FIG. 14.

In an embodiment, the top and bottom interlocking gaskets 500, 550, are integrally formed of an elastically deformable waterproof material. This enables the respective ridges 510, 512, 560, 562 to deform in directions opposite to the directions of their respective barbs 520, 530, 565 and 570 whenever the opposing pair of ramped surfaces 510b, 562b and the opposing pair of ramped surfaces 512b, 560b are pressed together, as shown in FIG. 13, until the opposing barbs capture one another and become locked together, as shown in FIG. 14. FIG. 15 is a plan view corresponding to FIG. 14. In the configuration of FIGS. 14 and 15, the hatch 110 is firmly fastened in place over the compartment 105, the interlocking gaskets 500, 550 providing a watertight seal, impervious to penetration by certain gas species (e.g., oxygen gas) or certain liquid species (e.g., water) or both. Because of the elastically deformable property of the interlocking gaskets 500, 550, the foregoing deformation sequence may be reversed to remove the hatch 110 from its locked position over the compartment 105. Such installation and removal of the hatch 110 may be repeated over many cycles, without requiring screws or the like.

Figure 12B:
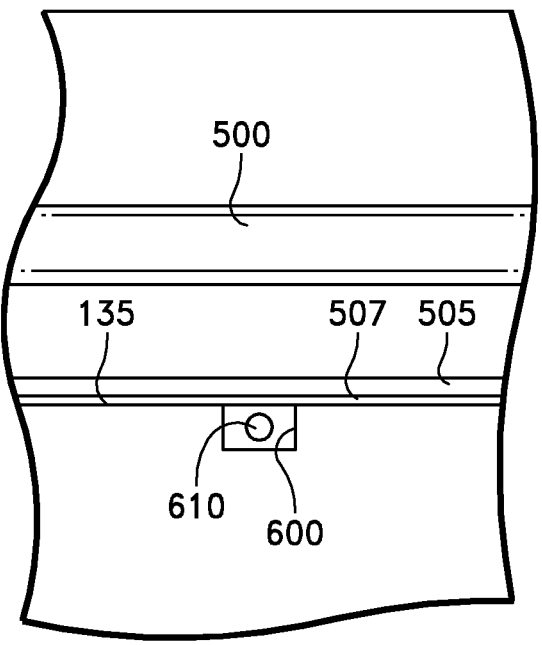
FIG. 12B is a cross-sectional view taken along lines 12B-12B of FIG. 12A.
Figures 12D, 12E:
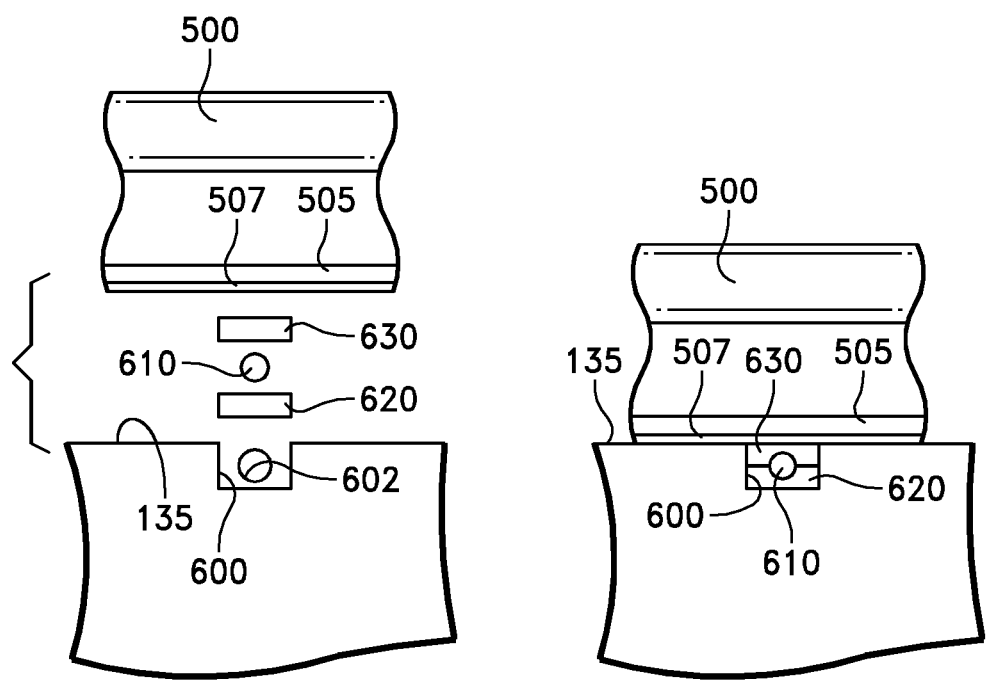
FIG. 12D is a cut-away side view corresponding to FIG. 12A.
FIG. 12E is a cut-away side view corresponding to FIG. 12C of the second embodiment in an assembled state.
Figure 12C:
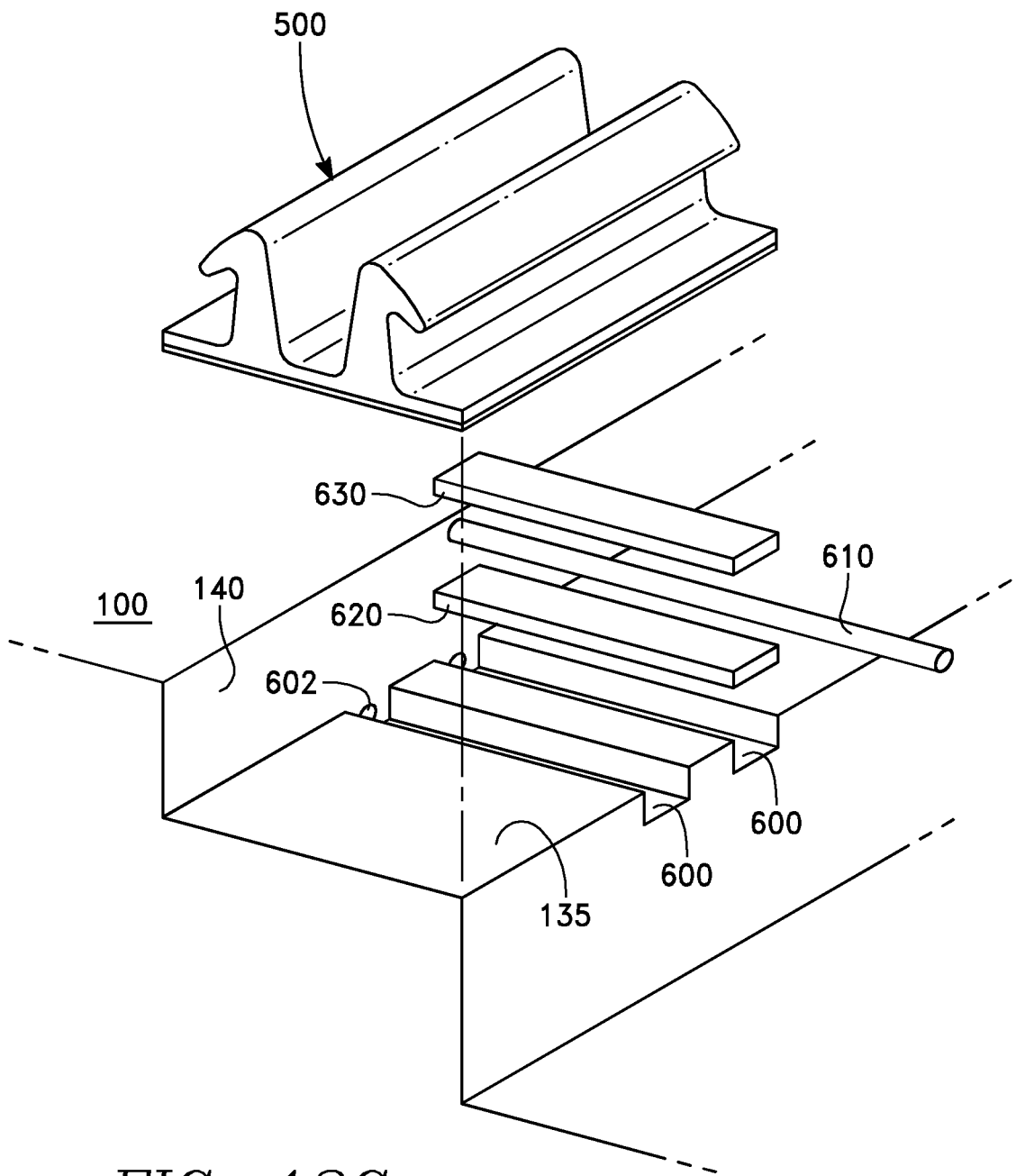
FIG. 12C is a perspective view corresponding to FIG. 12A.

Elongate communication elements, such as conduits, wires, tubes or optical fibers, communicating between the compartment 105 and other locations on the craft are accommodated with the interlocking gaskets 500, 550 by providing a channel 600 in the surface of the shoulder 135 for each elongate communication element, as shown in FIGS. 12A, 12B and 12C. Each channel 600 faces a matching hole or passage 602 open at the surface of the step 140, the passage 602 providing a path to other locations on the craft for a wire or conduit held in the channel 600. As indicated in FIGS. 12C and 12D, the channels 600 are formed, and elongate communication elements 610 are laid in the respective channels 600 prior to the installation or bonding of the bottom interlocking gasket 500 onto the shoulder 135. The channels 600 may be narrow, on the order of the diameter of the elongate communication elements, so as to not detract from the structural integrity of the body 100 in the vicinity of the base of the first interlocking gasket 500. As depicted in FIGS. 12C and 12D, a bottom gasket 620 is placed under the conduit 610 while a top gasket 630 is placed over the conduit 610 when the conduit 610 is placed in the channel 600. Thereafter, the bottom interlocking gasket 500 is pressed and bonded onto the surface of the shoulder 135, thereby compressing the bottom and top gaskets 620, 630 around the conduit 610 and covering each channel 600. Each gasket 620, 630 is formed of (or includes) a material of high conformability, such as (for example) the Dow Corning gel seal material referred to previously herein. As shown in FIG. 12E, the gaskets 620, 630 fill voids between the conduit or wire 610 and the interior surfaces of the channel 600, thereby providing a seal around the conduit or wire 610 that is impenetrable by either a liquid (e.g., water) or a gas (e.g., oxygen). The interlocking gaskets 500, 550 are elongate and mutually parallel, while the channels 600 are elongate and mutually parallel but transverse to the elongate interlocking gaskets 500, 550. In the illustrated embodiment, the channels 600 are transverse or perpendicular to the path of the interlocking gaskets 500, 550.

FIG. 12C shows the path of cable 610 and the seals 620 and 630 perpendicular to the gasket 500. However, the path of cable 610 and the seals 620 and 630 can be parallel to the gasket 500.

While the foregoing is directed to embodiments of the present invention, other and further embodiments of the invention may be devised without departing from the basic scope thereof, and the scope thereof is determined by the claims that follow.

What is claimed is:

1. An accessible sealable compartment in a body having an exterior body surface, and comprising:
   a compartment interior and a compartment sealing surface adjacent a top edge of said compartment interior;
   a hatch body having a hatch sealing surface congruent with and facing said compartment sealing surface;
   a hatch-to-compartment fastening structure;
   a first gasket between said compartment sealing surface and said hatch sealing surface, said first gasket comprising an adhesive material layer, a viscous gel material layer, and a non-adhesive layer comprised of foam, said adhesive material layer securing said first gasket to said compartment sealing surface;
   a second gasket between said compartment sealing surface and said hatch sealing surface, said second gasket comprising an adhesive material layer, a viscous gel material layer, and a non-adhesive layer comprised of foam, said adhesive material layer of said second gasket securing said second gasket to said hatch sealing surface;
   wherein said non-adhesive layer of said first gasket contacts said non-adhesive layer of said second gasket such that said non-adhesive layer of said first gasket contacts said non-adhesive layer of said second gasket and do not adhere to each other so as to allow the hatch to be removed from the compartment without the first gasket and the second gasket from otherwise adhering to each other;
   at least one elongate communication member having a portion lying between said compartment sealing surface and said hatch sealing surface, said at least one elongate communication member extending into said compartment interior from a location outside of said compartment interior.

2. The compartment of claim 1 wherein said viscous gel material has an elongation of 150% or greater.

3. The compartment of claim 1 wherein said viscous gel material has a conformability corresponding to an exclusion size on the order of one of: (a) a liquid molecule, (b) a gas molecule.

4. The compartment of claim 3 wherein one of: (a) said liquid molecule is a water molecule, or (b) said gas molecule is one of an oxygen gas molecule, a nitrogen gas molecule or a carbon dioxide molecule.

5. An accessible sealable compartment in a body having an exterior body surface, and comprising:
   a compartment interior and a compartment sealing surface adjacent a top edge of said compartment interior;
   a hatch body having a hatch sealing surface congruent with and facing said compartment sealing surface;
   a pair of interlocking gaskets comprising a first interlocking gasket on said compartment sealing surface and a second interlocking gasket on said hatch sealing surface, said first and second interlocking gaskets comprising an elastically deformable material; and at least one channel in said compartment sealing surface underlying said first interlocking gasket, said at least one channel extending between said compartment interior to a location outside of said compartment interior to allow at least one elongated communication member to pass therethrough.

6. The compartment of claim 5 further comprising a portion of at least one elongated communication member lying in said at least one channel and a sealing gasket in said channel and surrounding said at least one elongate communication member therewithin, said sealing gasket comprising an elastically conformable material.

7. The compartment of claim 6 wherein said sealing gasket comprises a first gasket underlying said elongate communication member and a second gasket overlying said elongate communication member.

8. The compartment of claim 6 wherein said elastically conformable material comprises a viscous gel.

9. The compartment of claim 6 wherein said elastically conformable material has a conformability corresponding to an exclusion size on the order of one of: (a) a liquid molecule, (b) a gas molecule.

10. The compartment of claim 9 wherein one of: (a) said liquid molecule is a water molecule, or (b) said gas molecule is one of an oxygen gas molecule, a nitrogen gas molecule or a carbon dioxide molecule.

11. The compartment of claim 6 wherein said elastically conformable material has an elongation of 150% or greater.

12. The compartment of claim 6 wherein said channel has a width corresponding to a diameter of said elongate communication member.

13. The compartment of claim 6 wherein said at least one elongate communication member comprises plural elongate communication members, and wherein said at least one channel comprises plural channels in said compartment sealing surface underlying said first interlocking gasket and said plural elongate communication members in said plural channels, and wherein said sealing gasket comprises plural sealing gaskets in said plural channels and surrounding said plural elongate communication members.

14. The compartment of claim 5 wherein first interlocking gasket comprises elongate inwardly extending barbs and said second interlocking gasket comprises elongate outwardly extending barbs matable with said elongate inwardly extending barbs.

15. The compartment of claim 5 wherein first interlocking gasket comprises elongate outwardly extending barbs and said second interlocking gasket comprises elongate inwardly extending barbs matable with said pair of elongate outwardly extending barbs.

16. The compartment of claim 5 wherein said first interlocking gasket and said second interlocking gasket are bonded to said compartment sealing surface and said hatch sealing surface, respectively.

* * * * *